(12) United States Patent
Pavlin et al.

(10) Patent No.: US 12,506,473 B2
(45) Date of Patent: Dec. 23, 2025

(54) ELECTRONIC DEVICE

(71) Applicants: STMICROELECTRONICS S.r.l., Agrate Brianza (IT); STMICROELECTRONICS (ROUSSET) SAS, Rousset (FR)

(72) Inventors: Antoine Pavlin, Puyricard (FR); Vanni Poletto, Milan (IT); Vincenzo Randazzo, Biancavilla (IT)

(73) Assignees: STMICROELECTRONICS S.r.l., Agrate Brianza (IT); STMICROELECTRONICS (ROUSSET) SAS, Rousset (FR)

( * ) Notice: Subject to any disclaimer, the term of this patent is extended or adjusted under 35 U.S.C. 154(b) by 329 days.

(21) Appl. No.: 18/064,840

(22) Filed: Dec. 12, 2022

(65) Prior Publication Data

US 2023/0198514 A1     Jun. 22, 2023

Related U.S. Application Data

(60) Provisional application No. 63/289,002, filed on Dec. 13, 2021.

(51) Int. Cl.
| | | |
|---|---|---|
| *H02H 3/00* | (2006.01) | |
| *H03K 17/0812* | (2006.01) | |
| *H03K 17/08* | (2006.01) | |
| *H10D 89/60* | (2025.01) | |

(52) U.S. Cl.
CPC ............... *H03K 17/08122* (2013.01); *H03K 2017/0806* (2013.01); *H10D 89/811* (2025.01)

(58) Field of Classification Search
None
See application file for complete search history.

(56) References Cited

U.S. PATENT DOCUMENTS

| | | | |
|---|---|---|---|
| 5,030,844 A | 7/1991 | Li et al. | |
| 6,373,671 B1 | 4/2002 | Watanabe et al. | |
| 7,340,662 B1 | 3/2008 | McElwee et al. | |
| 7,813,096 B2 | 10/2010 | Takahashi et al. | |
| 8,283,877 B2 * | 10/2012 | Lenk ................... | H05B 45/375 362/249.02 |
| 10,566,781 B2 | 2/2020 | Wang et al. | |
| 11,005,253 B2 | 5/2021 | Donath | |
| 11,955,790 B2 | 4/2024 | Wortberg | |

(Continued)

FOREIGN PATENT DOCUMENTS

| | | |
|---|---|---|
| CN | 101910856 A | 12/2010 |
| CN | 108282234 A | 7/2018 |

(Continued)

OTHER PUBLICATIONS

Chen et al, "Built-in self-test and self-calibration for analog and mixed signal circuits," 2019 IEEE International Test Conference, pp. 1-8.

*Primary Examiner* — Stephen W Jackson
(74) *Attorney, Agent, or Firm* — Seed Intellectual Property Law Group LLP

(57) ABSTRACT

The present disclosure relates to a device comprising a first transistor and a first circuit comprising first and second terminals, the first circuit being configured to generate a first voltage representing the temperature of the first transistor, a first terminal of the first circuit being coupled to the drain of the first transistor.

20 Claims, 6 Drawing Sheets

(56) References Cited

U.S. PATENT DOCUMENTS

| | | |
|---|---|---|
| 2002/0149972 A1 | 10/2002 | Lamb et al. |
| 2002/0174382 A1 | 11/2002 | Ledford et al. |
| 2008/0150671 A1 | 6/2008 | Lindqvist et al. |
| 2009/0257162 A1 | 10/2009 | Garrett |
| 2014/0347774 A1 | 11/2014 | Uehara |
| 2015/0009597 A1 | 1/2015 | Su et al. |
| 2016/0172841 A1 | 6/2016 | Lee et al. |
| 2017/0160764 A1* | 6/2017 | Suzuki ................ G05F 3/16 |
| 2017/0294774 A1 | 10/2017 | Illing et al. |
| 2018/0294643 A1 | 10/2018 | Donath |
| 2019/0026205 A1 | 1/2019 | Jin et al. |
| 2019/0178938 A1 | 6/2019 | Jin et al. |
| 2020/0266623 A1 | 8/2020 | Letor |
| 2021/0210953 A1 | 7/2021 | Letor |
| 2021/0278288 A1* | 9/2021 | Galy ................ G01K 7/015 |
| 2022/0065923 A1 | 3/2022 | Dondini et al. |
| 2022/0190816 A1 | 6/2022 | Castro et al. |
| 2022/0352705 A1 | 11/2022 | Ramsauer et al. |
| 2023/0187922 A1 | 6/2023 | Randazzo et al. |
| 2023/0198514 A1 | 6/2023 | Pavlin et al. |

FOREIGN PATENT DOCUMENTS

| | | | |
|---|---|---|---|
| CN | 110415751 A | 11/2019 | |
| EP | 3159992 A1 | 4/2017 | |
| JP | 2001298861 A | 10/2001 | |

\* cited by examiner

ELECTRONIC DEVICE

BACKGROUND

Technical Field

The present disclosure relates generally to electronic device, in particular, to device comprising a thermal sensor.

Description of the Related Art

Transistors tends to generate heat while current passes through it. This is particularly true for power transistors which are configured to let a current of high value pass through them. The heat generated can cause damages on the transistor and the components around the transistor if the heat gets too high.

Devices comprising such a transistor can comprise a circuit configured to measure the temperature of the transistor and determine if the temperature reaches a dangerous value.

BRIEF SUMMARY

There is a need for a precise circuit configured to determine the temperature of a transistor.

There is a need for a fast circuit configured to determine the temperature of a transistor.

One embodiment addresses all or some of the drawbacks of known device comprising a circuit configured to determine the temperature of a transistor.

One embodiment provides a device comprising a first transistor and a first circuit comprising first and second terminals, the first circuit being configured to generate a first voltage representing the temperature of the first transistor, a first terminal of the first circuit being coupled to the drain of the first transistor.

According to an embodiment, the first terminal of the first circuit is connected to the drain of the first transistor.

According to an embodiment, the first transistor is coupled between a node of application of a supply voltage and a load configured to be powered by the supply voltage.

According to an embodiment, the first circuit comprises a thermistor, the first terminal being one of the terminals of the thermistor.

According to an embodiment, the first circuit comprises a diode, the first terminal being one of the terminals of the diode.

According to an embodiment, the device composes a chip, the first transistor and the first circuit being external to the chip.

According to an embodiment, the chip comprises a second circuit configured to generate, based on the first voltage, a second voltage representing the temperature of the first transistor in a voltage domain different from the voltage domain of the first voltage.

According to an embodiment, the device comprising a third circuit configured to generate a control signal for the first transistor according to the value of the second voltage.

According to an embodiment, the second circuit comprises a floating supply and a level shifter.

According to an embodiment, the floating supply comprises a first voltage source and a current source coupled in series between the first terminal of the first circuit and a node of application of a reference voltage.

According to an embodiment, the node coupling the first voltage source and the current source is coupled to the second terminal of the first circuit by a first resistor.

According to an embodiment, the level shifter comprises an amplifier, the amplifier having an inverting input coupled to the first terminal of the first circuit, and a non-inverting input coupled to the second terminal of the first circuit.

According to an embodiment, the non-inverting input of the amplifier is coupled to the first terminal by a second voltage source.

According to an embodiment, the floating supply comprises a second resistor, a second transistor and a third resistor coupled in series between the first terminal and a node of application of a reference voltage, a control terminal of the second transistor being coupled to the output of a first operational amplifier, the non-inverting input of the first operational amplifier being coupled to a node of application of a set voltage, the inverting input of the first operational amplifier being coupled to a node coupling the second transistor and the third resistor, the floating supply also comprising a third transistor coupled between the second terminal and the node of application of the reference voltage, a control terminal of the third transistor being coupled to the output of a second operational amplifier, the inverting input of the second operational amplifier being coupled to the second terminal of the first circuit, the non-inverting input of the second operational amplifier being coupled to a node coupling the second transistor and the second resistor.

According to an embodiment, the level shifter comprises a fourth resistor, a fourth transistor and a fifth resistor coupled in series between the first terminal and a node of application of a reference voltage, a control terminal of the fourth transistor being coupled to the output of a third operational amplifier, the non-inverting input of the third operational amplifier being coupled to the second terminal of the first circuit, the inverting input of the third operational amplifier being coupled to a node coupling the fourth transistor and the fourth resistor.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front," "back," "top," "bottom," "left," "right," etc., or to relative positional qualifiers, such as the terms "above," "below," "higher," "lower," etc., or to qualifiers of orientation, such as "horizontal," "vertical," etc., reference is made to the orientation shown in the figures.

Unless specified otherwise, the expressions "around", "approximately", "substantially" and "in the order of" signify within 10%, and preferably within 5%.

Figure 1:
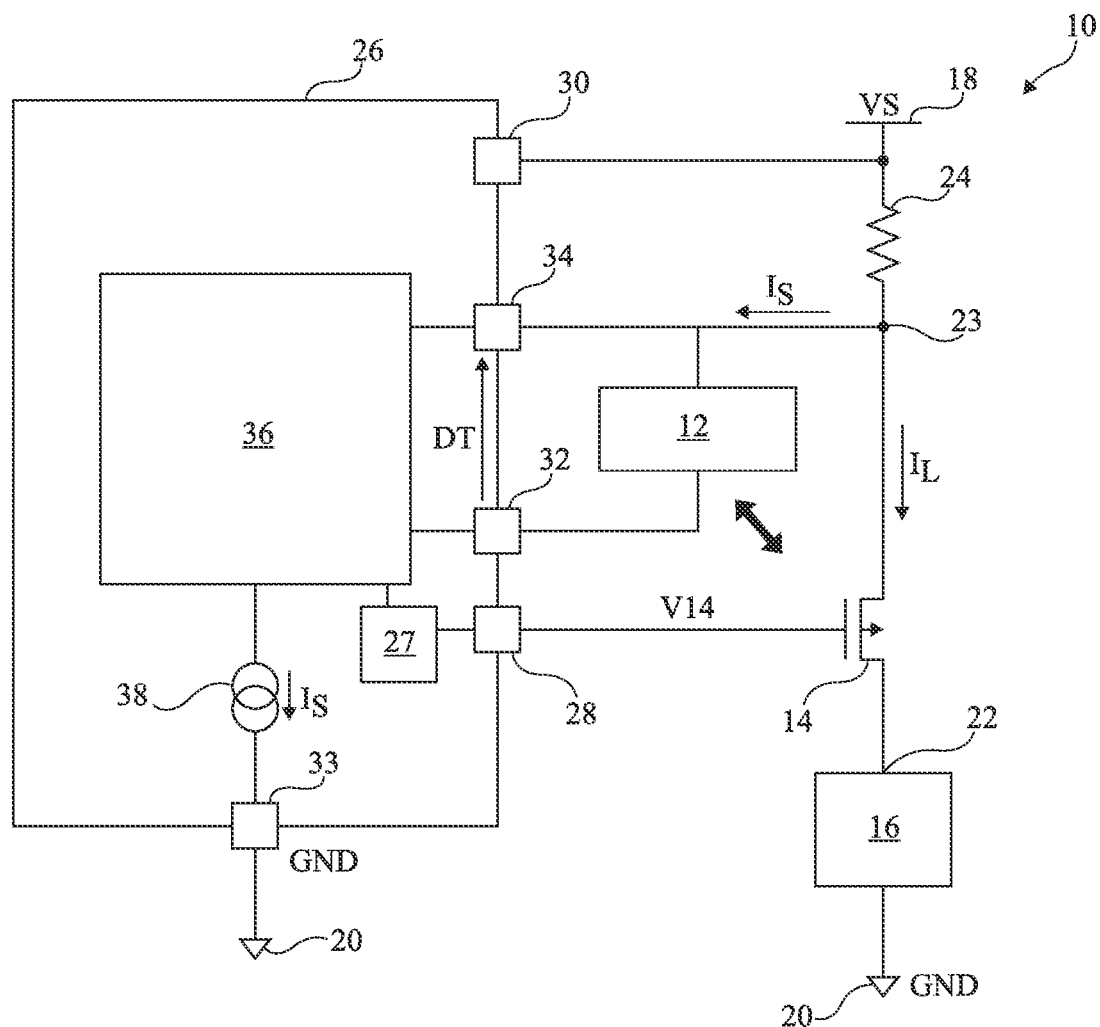
FIG. 1 illustrates an embodiment of a device comprising a circuit configured to determine the temperature of a transistor.

FIG. 1 illustrates an embodiment of a device 10 comprising a circuit 12 configured to determine the temperature of a transistor 14.

The device 10 comprises a load 16. The load 16 is powered by a supply voltage VS, applied on a node 18. The supply voltage is for example a high voltage, in other words, the supply voltage is for example higher than 10V, for example higher than 40 V, for example substantially equal to 48 V. The load 16 is coupled between the node 18 and a node 20 on which is applied a reference voltage GND, for example the ground. The load comprises a terminal 22 coupled to the node 18 and another terminal coupled, preferably connected, to the node 20.

The load 16 is coupled to the node 18 by the transistor 14. The transistor 14 is for example a Metal-oxide-semiconductor field-effect transistor (MOSFET). The transistor 14 is for example a power MOSFET. The transistor 14 is for example a transistor with a n-type channel.

A first terminal of the transistor 14, corresponding to the source of the transistor 14, is coupled, preferably connected, to the node 22 and a second terminal 23 of the transistor 14, corresponding to the drain of the transistor 14, is coupled, preferably connected, to the node 18.

In the embodiment of FIG. 1, the drain 23 of the transistor 14 is coupled to the node 18 by a resistor 24. A terminal of the resistor 24 is coupled, preferably connected, to node 18 and another terminal of the resistor 24 is coupled, preferably connected, to the drain 23 of the transistor 14.

The device 10 comprises a chip 26. The chip 26 is for example an integrated circuit. The chip 26, for example, comprises several circuits not represented, configured to implement one or more functions. The chip 26 comprises, in particular, a circuit 27 configured to control the transistor 14. The chip 26 comprises an input/output pad 28 on which is applied, by the circuit 27, a control signal V14 of the transistor 14. In other words, the circuit 27 comprises an output, on which is generated the control signal V14, coupled, preferably connected, to the input/output pad 28 of the chip 26. The output 28 of the chip is coupled, preferably connected, to the gate of the transistor 14. Therefore, the gate of the transistor 14 receives the signal V14.

The chip is for example supplied with the supply voltage VS. The chip comprises an input/output pad 30 coupled, preferably connected, to the node 18. The chip also comprises an input/output pad 33 coupled, preferably connected, to a node on which is applied a reference voltage, for example the node 20 on which is applied the voltage GND.

The transistor 14 is an external component to the chip 26. In other words, the transistor 14 is not comprised in the chip 26 or located on the chip 26. Similarly, the load 16 and the resistor 24 are for example external to the chip 26.

The device 10 comprises the circuit 12. The circuit 12 is external to the chip 26. The circuit 12 is configured to generate a signal DT, for example a voltage, representing the temperature around the circuit 12. The circuit 12 is configured to generate the signal DT representing the temperature of the transistor 14. The circuit 12 is close, and thermally coupled, enough to the transistor 14 that the variations of the signal DT represents the variation of the temperature of the transistor 14. The circuit 12 comprises an electrical component having a feature varying according to its temperature. This component is close enough to the transistor 14 that the variations of the signal DT represent the variation of the temperature of the transistor 14. For example, said component is less than 1 mm from the transistor 14.

A terminal of the circuit 12 is coupled, preferably connected, to the drain 23 of the transistor 14. Another terminal of the circuit 12 is coupled, preferably connected, to an input/output pad 32 of the chip 26. The chip 26 further comprises an input/output pad 34 coupled, preferably connected, to the drain 23 of the transistor 14. The signal DT is for example the voltage between the two terminals of the circuit 12. In other words, the signal DT is the voltage between the pads 32 and 34.

The transistor 14 for example comprises a bulk substrate. The bulk substrate is the heat dissipating terminal of the transistor 14. Most of the heat generated by the transistor 14 is dissipated by the bulk. Said bulk substrate corresponds to the drain terminal. Therefore, having a terminal of the circuit 12 coupled, preferably connected, to the drain, in other words to the bulk substrate, of the transistor 14 ensures that the circuit 12 is close to the heat generated by the transistor 14 and that it does not need to be electrically insulated from the transistor. Therefore, the signal DT representing the temperature of the transistor 14 is more precise.

The drain of the transistor 14 for example rests on a metal plate, forming the drain electrode. At least one component of the circuit 12 is for example formed in a semiconductor region resting on said metal plate. The heat generated in the transistor is therefore easily and quickly transferred from the transistor 14 to the circuit 12.

In consequence, a terminal of the circuit 12 is coupled to the node 18. The voltage on the input/output pad 34 is for example substantially equal to the voltage VS and the voltage on the input 32 is for example substantially equal to the voltage VS minus the voltage DT. Both values of voltage are high values, for example higher than 30 V. Such values might not be used by any circuit powered by a lower supply voltage, for example a supply voltage lower than 10 V, without damaging the component. For example, analog to digital converter might not be used on such signals.

The chip 26 comprises a circuit 36. The circuit 36 is configured to generate a signal, or voltage, representing the temperature of the transistor 14. For example, the circuit 36 is configured to generate a signal corresponding to the voltage DT in a different voltage domain. For example, the circuit 36 is configured to provide said signal to the circuit 27. The circuit 36 is for example coupled, preferably connected, to the circuit 27. Furthermore, the circuit 36 comprises a level shifter, not represented. The signal generated by the circuit 36 is for example shifted to a logic level. In other word the voltage generated by the circuit 16 can safely be used by circuit configured to be powered by a supply voltage lower than 10 V, for example substantially equal to 5 V. The circuit 36 for example comprises a terminal coupled to the pad 33 by a current source 38.

We could have chosen to place the circuit 12 physically close to the transistor 14 without connecting the circuit 12 to the drain of the transistor 14. For example, we could have chosen to couple a terminal of the circuit 12 to the node 20. Therefore, the circuit 12 could have been configured to be supplied with a supply voltage lower than the voltage VS, for example a voltage lower than 10 V, for example the supply voltage of logic circuits. In that case, the control circuit 36 associated to the circuit 12 would be in a different voltage domain than the transistor 14 and would not need to comprise a level shifter. However, the circuit 12 would need to be electrically insulated from the transistor 14. Any type of electrical insulation would imply some level of thermal insulation. Therefore, the measure of the temperature would be less precise and slower to react in case of overheating.

Figure 2:
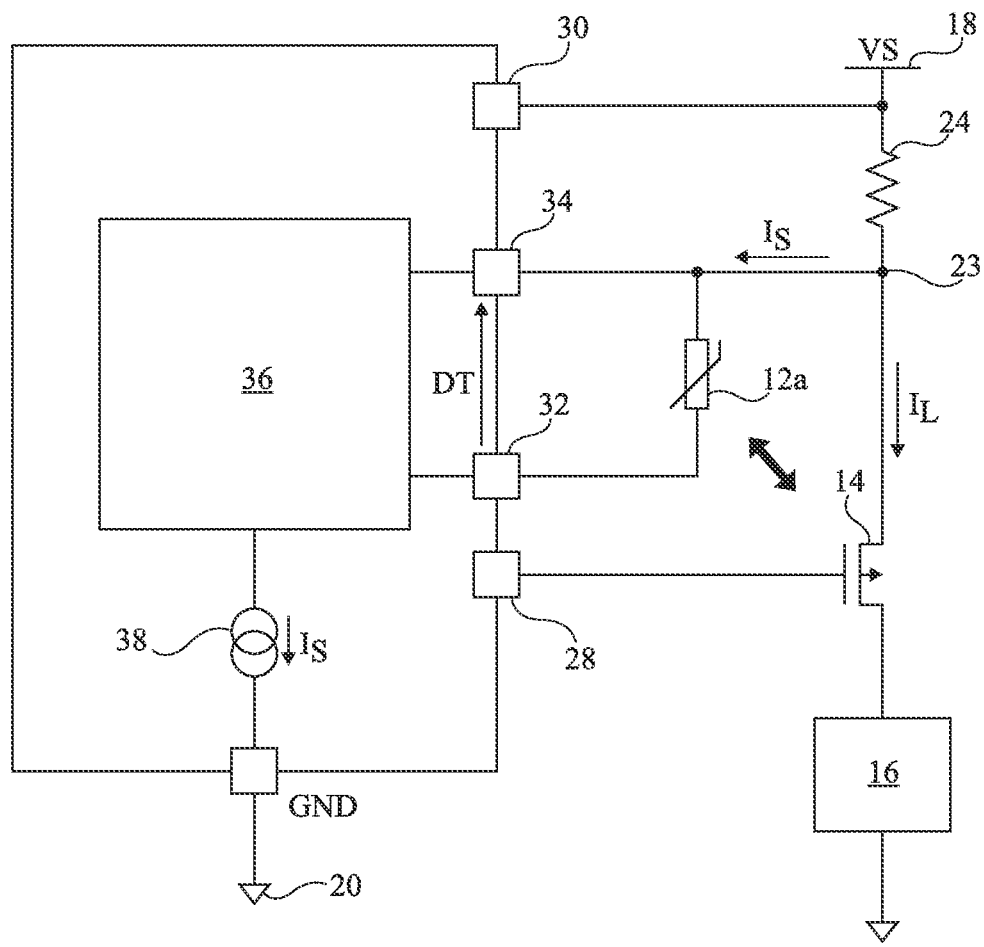
FIG. 2 illustrates another embodiment of a device comprising a circuit configured to determine the temperature of a transistor.

FIG. 2 illustrates another embodiment of a device comprising a circuit configured to determine the temperature of a transistor. More precisely, FIG. 2 illustrates in more detail a version of the embodiment of FIG. 1. FIG. 2 comprises all the elements of FIG. 1, which will not be described again.

In the variant of FIG. 2, the circuit 12 comprises a thermistor 12a, in other words a type of resistor whose resistance is strongly dependent on temperature. For example, the circuit 12 only comprises the thermistor 12a. The thermistor 12a is for example a thermistor with a negative temperature coefficient (NTC). The thermistor 12a is an external component to the chip 26.

The thermistor 12a is coupled between the drain 23 of the transistor 14 and the input/output pad 32. In other words, a terminal of the thermistor 12a is coupled, preferably connected, to the drain 23 of the transistor 14. Another terminal of the thermistor is coupled, preferably connected, to the pad 32, and therefore to the circuit 36. For example, the thermistor 12a is less than 1 mm from the transistor 14. As the drain 23 is coupled, preferably connected, to the pad 34, the thermistor 12a is coupled between the pads 32 and 34. The voltage DT representing the temperature of the transistor 14 corresponds to the voltage between the terminals of the thermistor 12a.

According to another embodiment, the thermistor 12a could for example be a thermistor with a positive temperature coefficient (PTC).

Figure 3:
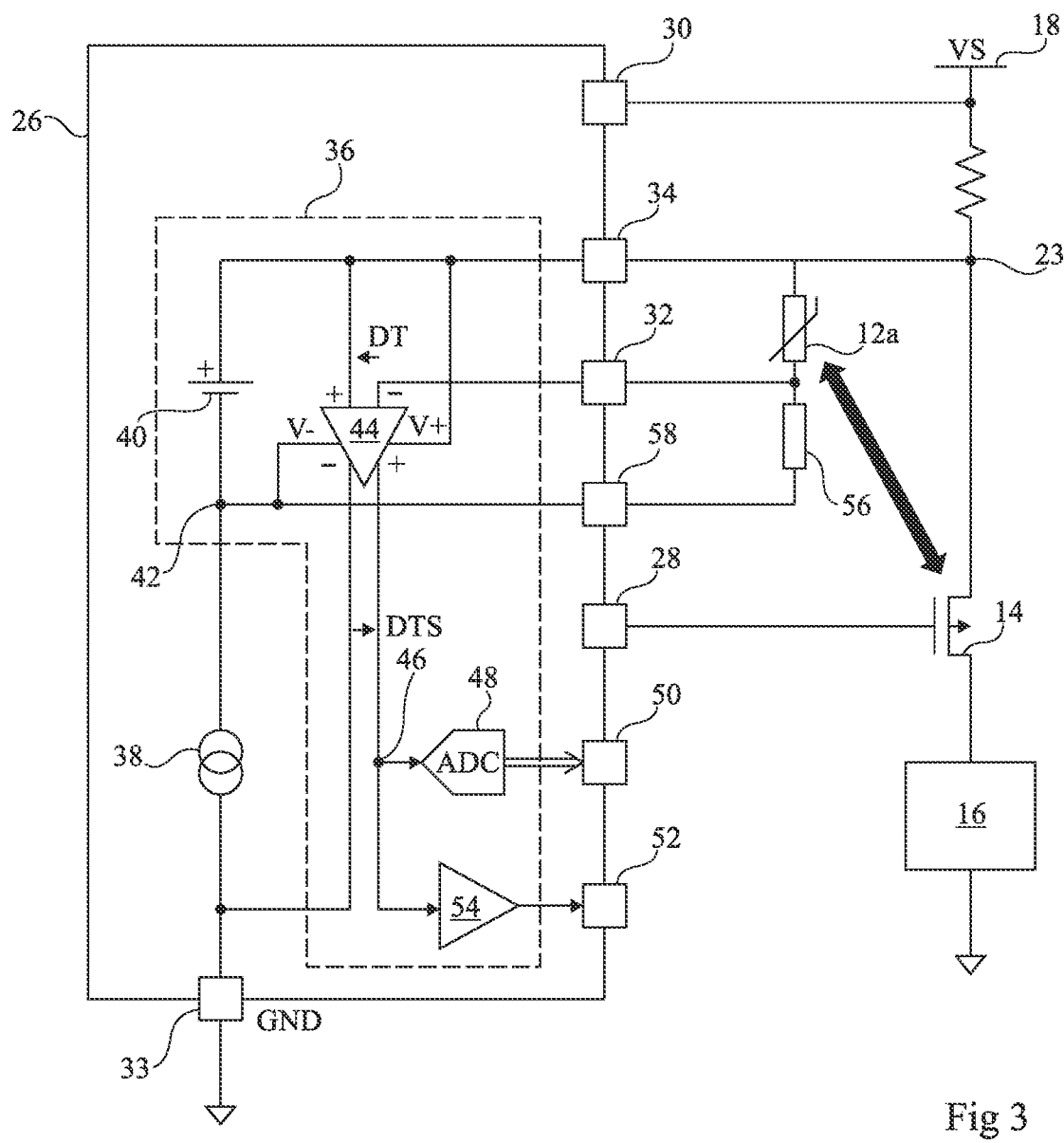
FIG. 3 illustrates in more detail an example of implementation of the embodiment of FIG. 2.

FIG. 3 illustrates in more detail an example of implementation of the embodiment of FIG. 2. FIG. 3 comprises all the elements of FIG. 2, which will not be described again.

The circuit 36 comprises a floating supply. In the example of FIG. 3, the floating supply is implemented by a voltage source 40 coupled in series with the current source 38. The sources 38 and 40 are coupled between the pads 34 and 33. The source 40 is coupled between the pad 34 and a node 42 and the source 38 is coupled between the node 42 and the pad 33. In other words, a terminal, for example the positive terminal (+) of the source 40 is coupled, preferably connected, to the pad 34 and another terminal, for example the negative terminal, of the source 40 is coupled, preferably connected, to the node 42. A terminal of the source 38 is coupled, preferably connected, to the pad 33 and another terminal of the source 38 is coupled, preferably connected, to the node 42.

The circuit 36 comprises a level shifter. The level shifter comprises an amplifier 44. The amplifier 44 comprises first and second inputs configured to receive the voltage DT. In other words, the first input, for example the negative input (−), is coupled, preferably connected, to the pad 32, in other words to one of the terminals of the thermistor 12a. The second input, for example the positive input (+), is coupled, preferably connected, to the pad 34, in other words to the other one of the terminals of the thermistor 12a.

The amplifier 44 also comprises a terminal configured to receive a first supply voltage V+. Said terminal is for example coupled, preferably connected, to the pad 34. The voltage V+ is for example substantially equal to the voltage VS. The amplifier 44 also comprises a terminal configured to receive a second supply voltage V−. Said terminal is for example coupled, preferably connected, to the node 42. The voltage V− is for example lower than the first supply voltage V+.

The amplifier 44 comprises first and second outputs configured to generate a voltage DTS, corresponding to the voltage DT shifted to another voltage domain. In other words, the first output, for example the negative output (−), is coupled, preferably connected, to the pad 33, in other words to the node of application of the reference voltage GND. The second output, for example the positive output (+), is coupled, preferably connected, to a node 46. Therefore, the voltage DTS on the node 46 is referenced on the reference voltage GND.

In the example of FIG. 3, the circuit 36 comprises a converter 48 analog to digital (ADC). The converter 48 comprises an input coupled, preferably connected, to the node 46. The converter 48 comprises an output on which is generated a digital signal representing the signal DT. Said output is for example coupled, preferably connected, to an input/output pad 50. Therefore, the chip 26 for example generates on the pad 50 a binary signal representing the temperature of the transistor 14.

The node 46 is also for example coupled, preferably connected, to an input/output pad 52, for example by an amplifier 54. In other words, the amplifier 54 comprises an input coupled, preferably connected, to the node 46 and an output coupled, preferably connected, to the pad 52. Therefore, the chip 26 for example generates on the pad 52 an analog signal representing the temperature of the transistor 14.

According to another embodiment, the chip 26 can comprise the converter 48 and the pad 50 but not the amplifier 54 and the pad 52. The chip 26 can also comprise the amplifier 54 and the pad 52 and not the converter 48 and the pad 50.

Either or both of the pads 50 and 52 can for example be coupled to a circuit not represented configured to determine if the temperature of the transistor 14 is higher than a given value. If this is the case, said circuit can ensure that the transistor is switched off, for example by changing the value of the control signal on the gate of the transistor 14.

According to another embodiment, the circuit not represented configured to determine if the temperature of the transistor 14 is higher than a given value is located on the chip 26. Therefore, the output of the converter 48 and/or the output of the amplifier 54 can be coupled, preferably connected, to said circuit not represented and may not be coupled to input/output pads. Said circuit not represented can for example be associated with the circuit configured to generate the control signal of the transistor 14.

In the example of FIG. 3, the device also comprises a resistor 56. The resistor 56 is for example external to the chip 26. The resistor is coupled in series with the thermistor 12a between the drain 23 and the node 42. More precisely, the resistor 56 is coupled between the input/output pad 32 and an input/output pad 58 of the chip 26. A terminal of the resistor 56 is coupled, preferably connected, to the pad 32 and another terminal of the resistor 56 is coupled, preferably connected, to the pad 58. The pad 58 is coupled, preferably connected, to the node 42.

Figure 4:
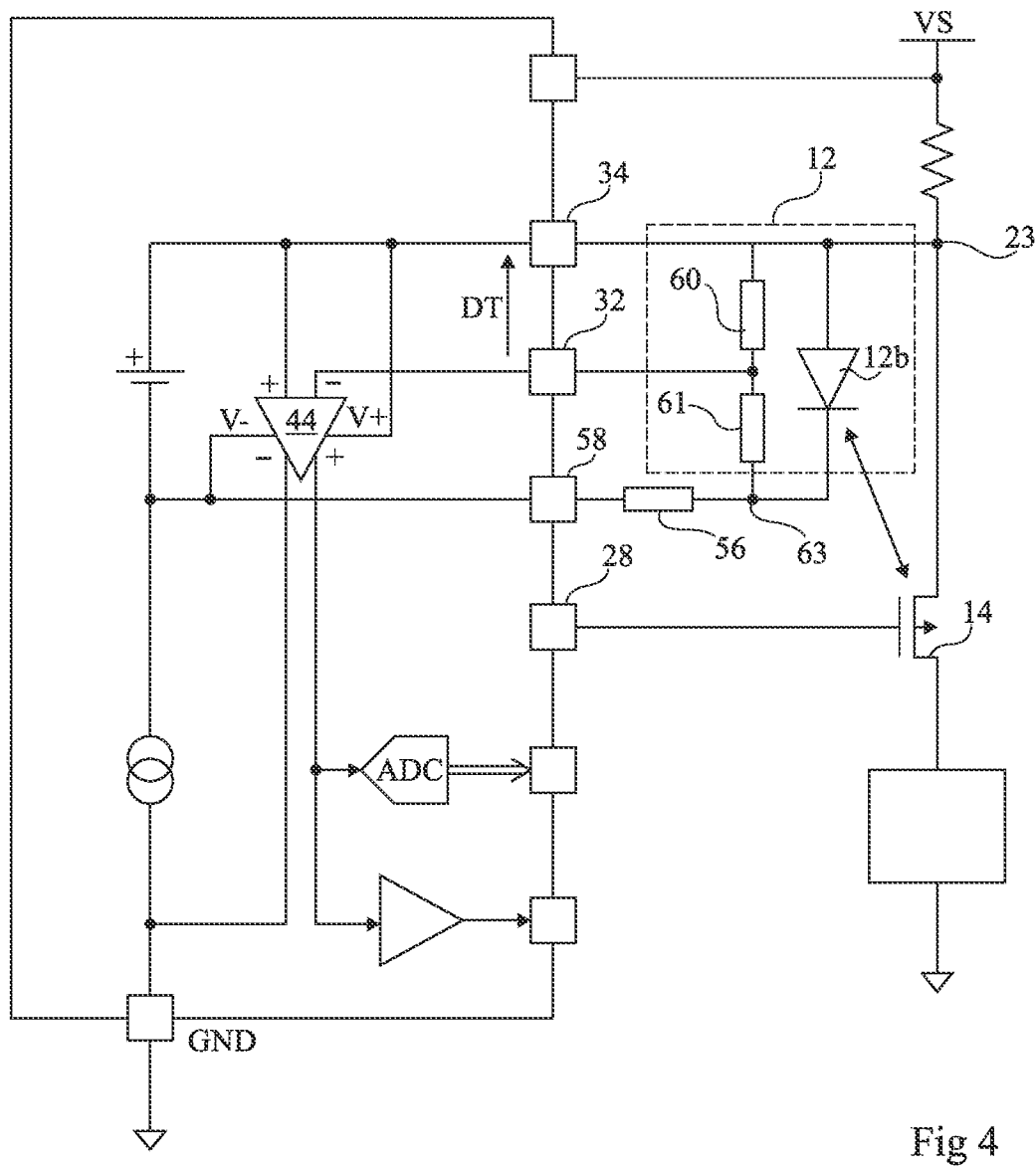
FIG. 4 illustrates another embodiment of a device comprising a circuit configured to determine the temperature of a transistor.

FIG. 4 illustrates another embodiment of a device comprising a circuit configured to determine the temperature of a transistor. FIG. 4 comprises all the elements of FIG. 3, which will not be described again.

The device of FIG. 4 differs from the device of FIG. 3 in that the thermistor 12a is replaced by resistors 60 and 61 and a diode 12b. Therefore the circuit 12 comprises the resistors 60 and 61 and the diode 12b. The resistors 60 and 61 are coupled in series between the node 23 and a node 63. In other words, a terminal of the resistor 60 is coupled, preferably connected, to the drain 23 and to the pad 34. Another terminal of the resistor 60 is coupled, preferably connected, to the pad 32. A terminal of the transistor 61 is coupled, preferably connected, to the pad 32 and another terminal is coupled, preferably connected, to the node 63.

In this embodiment, the resistor 56 is coupled between the node 63 and the pad 58. In other words, a terminal of the resistor 56 is coupled, preferably connected, to the node 63 and another terminal of the resistor 56 is coupled, preferably connected, to the pad 58. The pad is therefore coupled to the pad 32 by two resistors in series.

The diode 12b of circuit 12 comprises a terminal, for example the anode, coupled, preferably connected, to the drain 23. The diode 12b comprises another terminal, for example the cathode, for example coupled, preferably connected, to the node 63. Therefore, the diode 12b is coupled in parallel with the association of the resistors 60 and 61.

The voltage between the terminals of the diode 12b, corresponding substantially to the voltage between the pads 34 and 58, is dependent on the temperature of the transistor 14. Furthermore, the voltage DT, corresponding to the voltage between the pads 32 and 34, depends on the voltage between the terminals of the diode 12b and therefore on the temperature. The diode 12b is preferably located as close as possible to the transistor 14. For example, the semiconductor region corresponding to the anode of the diode 12b lays, and is preferably in contact with, the metal plate on which lays the semiconductor region corresponding to the drain of the transistor 14.

Figure 5:
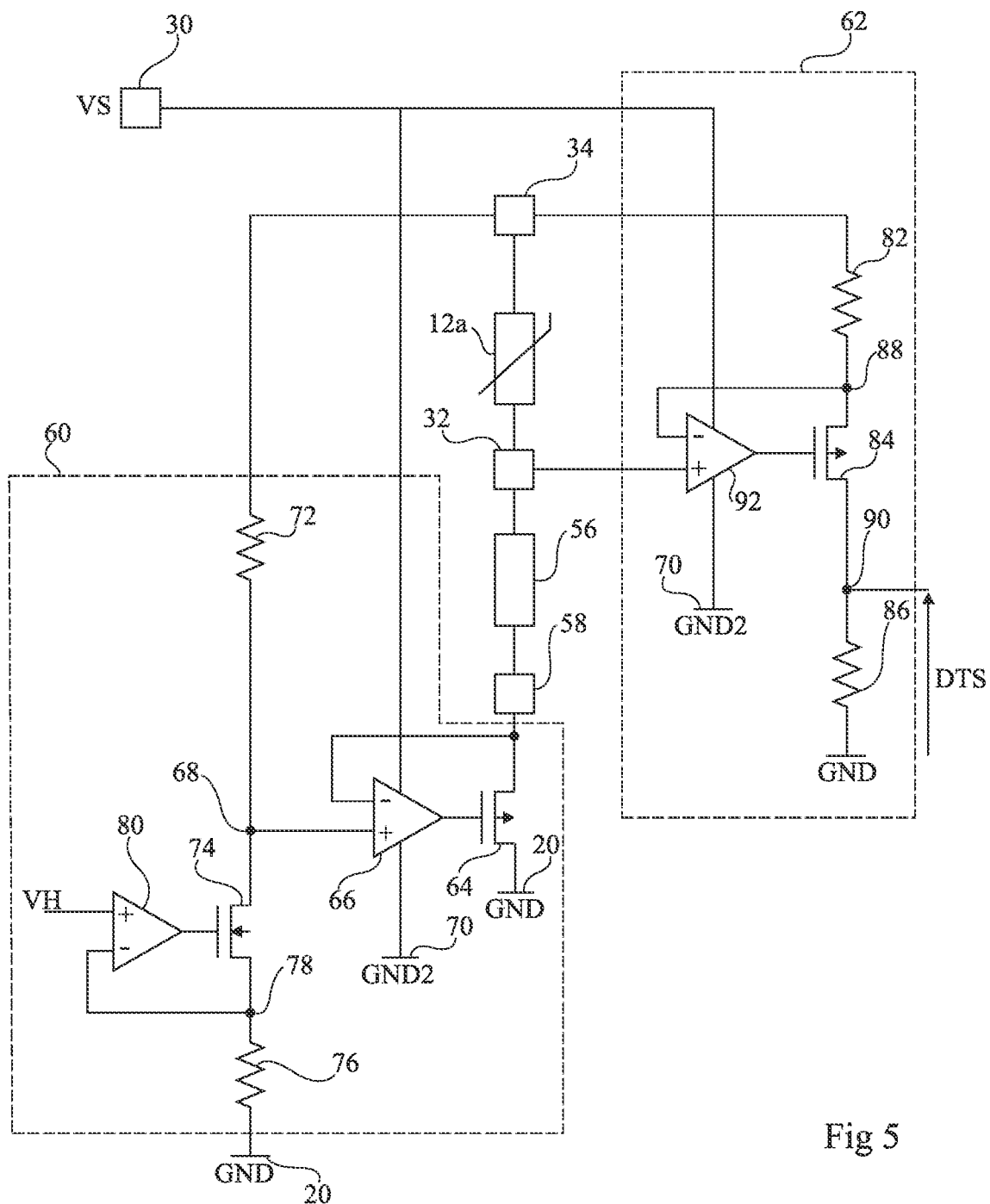
FIG. 5 illustrates in more detail a part of the embodiment of FIGS. 1 to 4.

FIG. 5 illustrates in more detail a part of the embodiments of FIGS. 1 to 4. More precisely, FIG. 5 represents in more detail a part of the circuit 36.

FIG. 5 represents the pads 30, 32, 34 and 58 as well as the thermistor 12a and the resistor 56 of FIG. 3. These elements are the same as in FIG. 3 and will not be described again.

FIG. 5 represents a floating supply 60 and a level shifter 62. The floating supply 60 and the level shifter 62 are comprised in the circuit 36. The floating supply 60 and the level shifter 62 are preferably located on the chip 26. The floating supply 60 for example replaces the sources 38 and 40 of FIG. 3. The level shifter for example replaces the amplifier 44.

The floating supply 60 comprises a transistor 64. The transistor 64 is for example a MOSFET. The transistor 64 has for example a p-type channel. The transistor 64 is coupled between the pad 58 and the node 20 of application of the reference voltage GND. In other words, a terminal of the transistor 64, drain or source, for example the source, is coupled, preferably connected, to the pad 58 and another terminal of the transistor 64, drain or source, for example the drain, is coupled, preferably connected, to the node 20.

The floating supply 60 comprises an operational amplifier 66. The amplifier 66 is configured to generate the control signal of the transistor 64. The amplifier 66 comprises an output coupled, preferably connected, to the control terminal, or gate, of the transistor 64. The amplifier 66 comprises a non-inverting input coupled, preferably connected, to a node 68. The amplifier 66 comprises an inverting input coupled, preferably connected, to the pad 58. The amplifier 66 receives the supply voltage VS. More precisely, the amplifier comprises an input coupled, preferably connected, to the node 30 and another input coupled, preferably connected, to a node 70 of application of a reference voltage GND2. The voltage GND2 is for example different from the reference voltage GND.

The floating supply 60 also comprises a resistor 72, a transistor 74 and a resistor 76 coupled in series between the pad 34 and the node 20. More precisely, the resistor 72 is coupled between the pad 34 and the node 68. In other words, a terminal of the resistor 72 is coupled, preferably connected, to the pad 34 and another terminal of the resistor 72 is coupled, preferably connected, to the node 68.

The transistor 74 is for example a MOSFET. The transistor 74 has for example a n-type channel. The transistor 74 is coupled between the node 68 and a node 78. In other words, a terminal of the transistor 74, drain or source, for example the source, is coupled, preferably connected, to the node 78 and another terminal of the transistor 74, drain or source, for example the drain, is coupled, preferably connected, to the node 68.

The resistor 76 is coupled between the node 78 and the node 20. In other words, a terminal of the resistor 76 is coupled, preferably connected, to the node 78 and another terminal of the resistor 76 is coupled, preferably connected, to the node 20.

The floating supply 60 further comprises an operational amplifier 80. The amplifier 80 is configured to generate the control signal of the transistor 74. The amplifier 80 comprises an output coupled, preferably connected, to the control terminal, or gate, of the transistor 74. The amplifier 80 comprises a non-inverting input configured to receive a set voltage VH. The amplifier 80 comprises an inverting input coupled, preferably connected, to the node 78.

The current source 38 of FIG. 3 is replaced in FIG. 5 by the amplifier 80, the transistor 74 and the resistor 76. The voltage source of FIG. 3 is replaced in FIG. 5 by the resistor 72, the operational amplifier 66 and the transistor 64.

The level shifter 62 comprises a resistor 82, a transistor 84 and a resistor 86 coupled in series between the pad 34 and the node 20. More precisely, the resistor 82 is coupled between the pad 34 and a node 88. In other words, a terminal of the resistor 82 is coupled, preferably connected, to the pad 34 and another terminal of the resistor 82 is coupled, preferably connected, to the node 88

The transistor 84 is for example a MOSFET. The transistor 84 has for example a p-type channel. The transistor 84 is coupled between the node 88 and a node 90. In other words, a terminal of the transistor 84, drain or source, for example the source, is coupled, preferably connected, to the node 88 and another terminal of the transistor 84, drain or source, for example the drain, is coupled, preferably connected, to the node 90.

The resistor 86 is coupled between the node 90 and the node 20. In other words, a terminal of the resistor 86 is coupled, preferably connected, to the node 90 and another terminal of the resistor 86 is coupled, preferably connected, to the node 20.

The node 90 correspond to the output of the level shifter. Therefore, the voltage DTS of FIG. 3 corresponds to the voltage between the nodes 90 and 20. The node 90 is for example coupled to a converter analog to digital, such as the converter 48 of FIG. 3, and/or to an amplifier, such as the amplifier 54 of FIG. 3.

The level shifter 62 further comprises an operational amplifier 92. The amplifier 92 is configured to generate the control signal of the transistor 84. The amplifier 92 comprises an output coupled, preferably connected, to the control terminal, or gate, of the transistor 84. The amplifier 92 comprises a non-inverting input coupled, preferably connected, to the pad 32. The amplifier 92 comprises an inverting input coupled, preferably connected, to the node 88.

The amplifier 92 receives the supply voltage VS. More precisely, the amplifier 92 comprises an input coupled, preferably connected, to the node 30 and another input coupled, preferably connected, to the node 70 of application of the reference voltage GND2.

Figure 6:
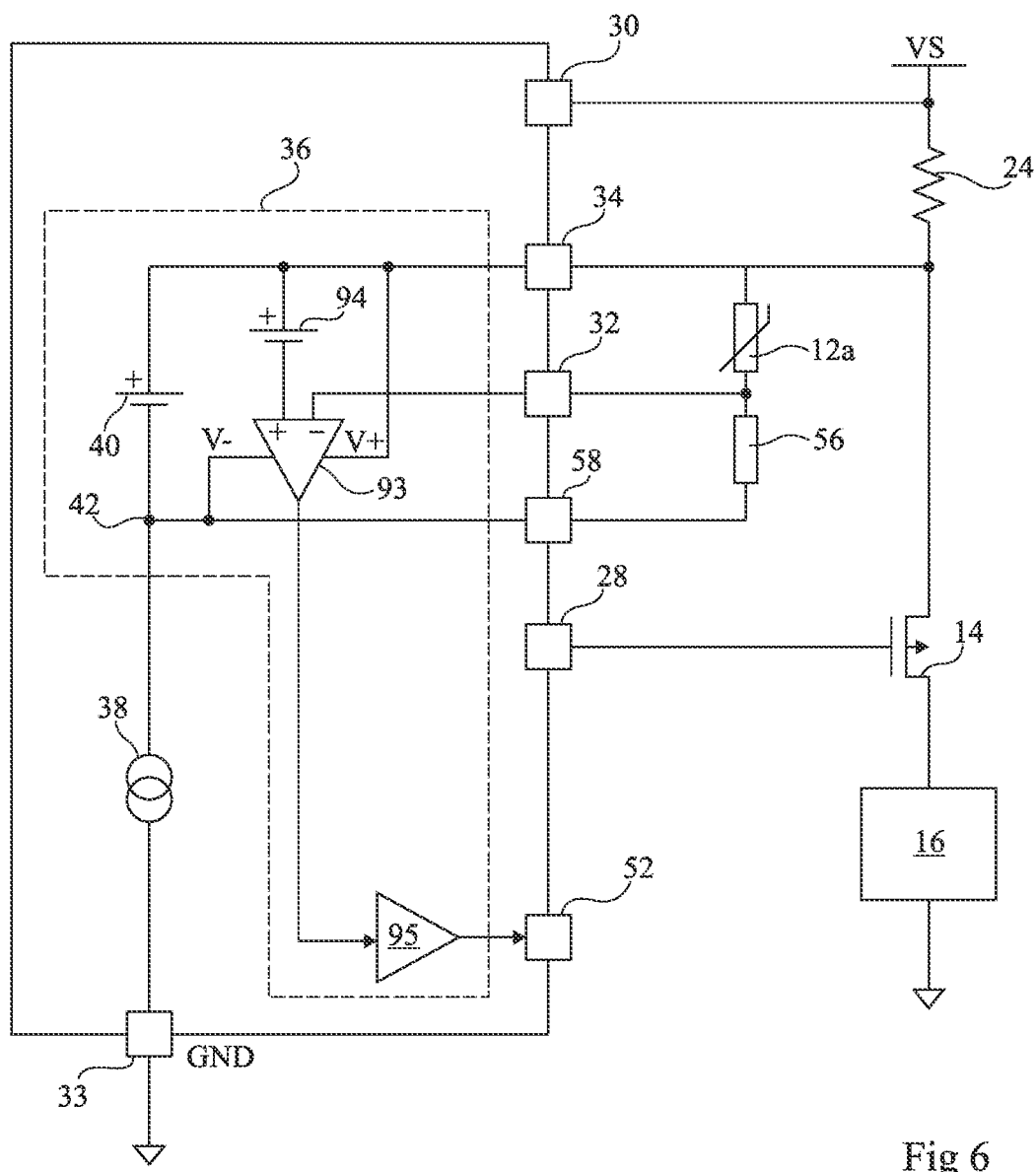
FIG. 6 illustrates another embodiment of a device comprising a circuit configured to determine the temperature of a transistor.

FIG. 6 illustrates another embodiment of a device comprising a circuit 12a configured to determine the temperature of a transistor 14. More precisely, FIG. 6 represents an alternative to the circuit 36 of FIG. 3.

The device of FIG. 6 comprises several elements of the device of FIG. 3, which will not be described again. In particular, the device of FIG. 6 comprises the resistor 24, the thermistor 12a, the resistor 56, the transistor 14, the load 16 and the sources 38 and 40.

The device of FIG. 6 differs from the device of FIG. 3 in that the circuit 36 does not comprise the converter 48, that the amplifier 44 of FIG. 3 is replaced by a comparator 93 and the amplifier 54 is replaced by a digital output buffer 95. The chip 26 does not, therefore, comprise the pad 50 configured in FIG. 3 to provide the binary output signal.

The comparator 93 comprises an output, for example a single output, coupled to the pad 52 by the buffer 95. The output of the comparator is coupled, preferably connected, to an input of the buffer 95. An output of the buffer is coupled, preferably connected, to the pad 52.

The comparator 93 comprises, like the amplifier 44 of FIG. 3, a terminal configured to receive a first supply voltage V+. Said terminal is for example coupled, preferably connected, to the pad 34. The voltage V+ is for example substantially equal to the voltage VS. The comparator 93 also comprises a terminal configured to receive a second supply voltage V−. Said terminal is for example coupled, preferably connected, to the node 42. The voltage V− is for example lower than the first supply voltage V+.

The comparator 93 comprises an input, for example a negative input (−), coupled, preferably connected, to the pad 32. The comparator 93 comprises another input, for example a positive (+) input, coupled to the pad 34 by a voltage source 94. In other words, a terminal of the source 94, for example the positive (+) terminal, is coupled, preferably connected, to the node 34 and another terminal of the source 94 is coupled, preferably connected, to the input of the amplifier 44, for example the positive input.

The embodiment of FIG. 6 compares the temperature of the transistor 14 to a given threshold. More precisely, the circuit 26 compares, with the comparator 93, a voltage value on the pad 32 representing the temperature of the transistor 14 to a voltage, provided by the source 94. Therefore, the circuit 26 provides on the pad 52 a first value if the temperature of the transistor 14 is below the threshold and a second value if the temperature of the transistor 14 is above the threshold.

An advantage of the embodiments describes is that the detection of the temperature is more precise and faster.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

A device may be summarized as including a first transistor and a first circuit including first and second terminals, the first circuit being configured to generate a first voltage representing the temperature of the first transistor, a first terminal of the first circuit being coupled to the drain of the first transistor.

The first terminal of the first circuit may be connected to the drain of the first transistor.

The first transistor may be coupled between a node of application of a supply voltage and a load configured to be powered by the supply voltage.

The first circuit may include a thermistor, the first terminal being one of the terminals of the thermistor.

The first circuit may include a diode, the first terminal being one of the terminals of the diode.

The device may include a chip, the first transistor and the first circuit being external to the chip.

The chip may include a second circuit configured to generate, based on the first voltage, a second voltage representing the temperature of the first transistor in a voltage domain different from the voltage domain of the first voltage.

The device may include a third circuit configured to generate a control signal for the first transistor according to the value of the second voltage.

The second circuit may include a floating supply and a level shifter.

The floating supply may include a first voltage source and a current source coupled in series between the first terminal of the first circuit and a node of application of a reference voltage.

The node coupling the first voltage source and the current source may be coupled to the second terminal of the first circuit by a first resistor.

The level shifter may include an amplifier, the amplifier having an inverting input coupled to the first terminal of the first circuit, and a non-inverting input coupled to the second terminal of the first circuit.

The non-inverting input of the amplifier may be coupled to the first terminal by a second voltage source.

The floating supply may include a second resistor, a second transistor and a third resistor coupled in series between the first terminal and a node of application of a reference voltage, a control terminal of the second transistor being coupled to the output of a first operational amplifier, the non-inverting input of the first operational amplifier being coupled to a node of application of a set voltage, the inverting input of the first operational amplifier being coupled to a node coupling the second transistor and the third resistor, the floating supply also may include a third transistor coupled between the second terminal and the node of application of the reference voltage, a control terminal of the third transistor being coupled to the output of a second operational amplifier, the inverting input of the second operational amplifier being coupled to the second terminal of the first circuit, the non-inverting input of the second operational amplifier being coupled to a node coupling the second transistor and the second resistor.

The level shifter may include a fourth resistor, a fourth transistor and a fifth resistor coupled in series between the first terminal and a node of application of a reference voltage, a control terminal of the fourth transistor being coupled to the output of a third operational amplifier, the non-inverting input of the third operational amplifier being coupled to the second terminal of the first circuit, the inverting input of the third operational amplifier being coupled to a node coupling the fourth transistor and the fourth resistor.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a first transistor;
a first circuit having first and second terminals, the first circuit being configured to generate a first voltage representing a temperature of the first transistor, a first terminal of the first circuit being coupled to a drain of the first transistor;
a chip, the first transistor and the first circuit being external to the chip, wherein the chip comprises a second circuit configured to generate, based on the first voltage, a second voltage representing the temperature of the first transistor in a voltage domain different from the voltage domain of the first voltage; and
a third circuit configured to generate a control signal for the first transistor according to the value of the second voltage.

2. The device of claim 1 wherein the first terminal of the first circuit is coupled to a drain terminal of the first transistor.

3. The device of claim 1 wherein the first transistor is coupled between a node of a supply voltage and a load configured to be powered by the supply voltage.

4. The device of claim 1 wherein the first circuit comprises a thermistor, the first terminal being one of the terminals of the thermistor.

5. The device of claim 1 wherein the first circuit comprises a diode, the first terminal being one of the terminals of the diode.

6. The device of claim 1 wherein the second circuit comprises a floating supply and a level shifter.

7. The device of claim 6 wherein the floating supply comprises a first voltage source and a current source coupled in series between the first terminal of the first circuit and a node of application of a reference voltage.

8. The device of claim 7 wherein the node coupling the first voltage source and the current source is coupled to the second terminal of the first circuit by a first resistor.

9. The device of claim 6 wherein the level shifter comprises an amplifier, the amplifier having an inverting input coupled to the first terminal of the first circuit, and a non-inverting input coupled to the second terminal of the first circuit.

10. The device of claim 9 wherein the non-inverting input of the amplifier is coupled to the first terminal by a second voltage source.

11. The device of claim 6 wherein the floating supply comprises a second resistor, a second transistor and a third resistor coupled in series between the first terminal and a node of application of a reference voltage, a control terminal of the second transistor being coupled to an output of a first operational amplifier, a non-inverting input of the first operational amplifier being coupled to a node of application of a set voltage, the inverting input of the first operational amplifier being coupled to a node coupling the second transistor and the third resistor, the floating supply also comprising a third transistor coupled between the second terminal and the node of application of the reference voltage, a control terminal of the third transistor being coupled to the output of a second operational amplifier, the inverting input of the second operational amplifier being coupled to the second terminal of the first circuit, the non-inverting input of the second operational amplifier being coupled to a node coupling the second transistor and the second resistor.

12. The device of claim 6 wherein the level shifter comprises a fourth resistor, a fourth transistor and a fifth resistor coupled in series between the first terminal and a node of application of a reference voltage, a control terminal of the fourth transistor being coupled to an output of a third operational amplifier, a non-inverting input of the third operational amplifier being coupled to the second terminal of the first circuit, the inverting input of the third operational amplifier being coupled to a node coupling the fourth transistor and the fourth resistor.

13. A device, comprising:
a first transistor; and
a first circuit having first and second terminals, the first circuit being configured to generate a first voltage representing a temperature of the first transistor, a first terminal of the first circuit being coupled to a drain of the first transistor;
a second circuit configured to generate, based on the first voltage, a second voltage representing the temperature of the first transistor in a voltage domain different from the voltage domain of the first voltage; and
a third circuit configured to generate a control signal for the first transistor according to the value of the second voltage.

14. The device of claim 13 wherein the second circuit comprises a floating supply and a level shifter.

15. A device, comprising:
a first transistor; and
a first circuit having first and second terminals, the first circuit being configured to generate a first voltage representing a temperature of the first transistor, a first terminal of the first circuit being coupled to the first transistor; and
a second circuit configured to generate, based on the first voltage, a second voltage representing the temperature of the first transistor in a voltage domain different from the voltage domain of the first voltage, the second circuit including:

a floating supply and a level shifter.

16. The device of claim 15 wherein the floating supply comprises a first voltage source and a current source coupled in series between the first terminal of the first circuit and a reference voltage.

17. The device of claim 14, wherein the floating supply comprises a first voltage source and a current source coupled in series between the first terminal of the first circuit and a node of application of a reference voltage.

18. The device of claim 17 wherein the node coupling the first voltage source and the current source is coupled to the second terminal of the first circuit by a first resistor.

19. The device of claim 14 wherein the level shifter comprises an amplifier, the amplifier having an inverting input coupled to the first terminal of the first circuit, and a non-inverting input coupled to the second terminal of the first circuit.

20. The device of claim 19 wherein the non-inverting input of the amplifier is coupled to the first terminal by a second voltage source.

* * * * *